(12) United States Patent
Finn et al.

(10) Patent No.: US 10,164,660 B1
(45) Date of Patent: Dec. 25, 2018

(54) SYNDROME-BASED REED-SOLOMON ERASURE DECODING CIRCUITRY

(71) Applicant: Intel Corporation, Santa Clara, CA (US)

(72) Inventors: Simon Finn, High Wycombe (GB); Martin Langhammer, Alderbury (GB); Sami Mumtaz, London (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/390,352

(22) Filed: Dec. 23, 2016

(51) Int. Cl.
| | | |
|---|---|---|
| *G11C 29/00* | (2006.01) | |
| *H03M 13/15* | (2006.01) | |
| *G06F 11/10* | (2006.01) | |
| *G11C 29/52* | (2006.01) | |
| *H03M 13/00* | (2006.01) | |

(52) U.S. Cl.
CPC ..... *H03M 13/1515* (2013.01); *G06F 11/1068* (2013.01); *G11C 29/52* (2013.01); *H03M 13/616* (2013.01)

(58) Field of Classification Search
CPC ... G06F 11/1068; G11C 29/52; H03M 13/616
See application file for complete search history.

(56) References Cited

U.S. PATENT DOCUMENTS

| | | |
|---|---|---|
| 4,675,869 A | 6/1987 | Driessen |
| 5,170,399 A | 12/1992 | Cameron et al. |
| 5,754,563 A | 5/1998 | White |
| 5,875,199 A | 2/1999 | Luthi |
| 6,041,431 A | 3/2000 | Goldstein |
| 6,175,945 B1 | 1/2001 | Okita |
| 6,233,710 B1 | 3/2001 | Okita |
| 6,275,965 B1 | 8/2001 | Cox et al. |
| 6,347,389 B1 | 2/2002 | Boyer |
| 6,378,105 B1 | 4/2002 | Chiang |

(Continued)

OTHER PUBLICATIONS

Langhammer et al., U.S. Appl. No. 15/197,433, filed Jun. 29, 2016.
Langhammer et al., U.S. Appl. No. 15/359,548, filed Nov. 22, 2016.

*Primary Examiner* — Samir W Rizk
(74) *Attorney, Agent, or Firm* — Treyz Law Group, P.C.; Jason Tsai

(57) ABSTRACT

An integrated circuit may include a Reed-Solomon decoder that receives a transmitted code word and an associated bit mask and that generates a corresponding corrected message. The bit mask indicates an erasure pattern for the received code word. The Reed-Solomon decoder may include a syndrome generator, a multiplication circuit, a read-only memory (ROM) circuit, an address compressor, and an aggregation circuit. The syndrome generator may receive the transmitted code word and generate a corresponding syndrome. The address compressor may receive the bit mask and generate a corresponding unique address for accessing the ROM circuit. The ROM circuit may then output an inverse parity matrix based on the unique address. The multiplication circuit may multiply the syndrome by the retrieved inverse parity matrix to output corrected symbols. The aggregation circuit may then path the received code word with the corrected symbols to obtain the corrected message.

14 Claims, 6 Drawing Sheets

(56) References Cited

U.S. PATENT DOCUMENTS

| | | |
|---|---|---|
| 6,532,566 B1 | 3/2003 | Chiang |
| 6,694,476 B1 | 2/2004 | Sridhara et al. |
| 8,176,397 B2 | 5/2012 | Panteleev |
| 8,347,192 B1 | 1/2013 | Langhammer et al. |
| 9,054,742 B2 | 6/2015 | Kwok |
| 2008/0065966 A1* | 3/2008 | Jiang ................ H03M 13/1515 714/781 |

* cited by examiner

SYNDROME-BASED REED-SOLOMON ERASURE DECODING CIRCUITRY

BACKGROUND

The present embodiments relate to Reed-Solomon decoding, and to circuitry for performing such decoding, particularly on an integrated circuit.

Many modern applications encode data prior to transmission of the data on a network using error-correcting codes such as Reed-Solomon codes. Such codes are capable of providing powerful error correction capability. For example, a Reed-Solomon code of length n and including n–k check symbols may detect any combination of up to 2t=n–k erroneous symbols and correct any combination of up to t symbols.

Reed-Solomon decoding is an important component of RAID (Redundant Array of Independent Disks) storage systems such as RAID 6 that uses dual parity. Conventionally, full Reed-Solomon decoding schemes include both error and erasure capabilities. As an error code, the decoder has to first identify the error location and can then correct up to t symbols as described above. As an erasure code, the decode is provided know error location(s) and can correct up to 2t known erasures. Alternatively, it can detect and correct combinations of errors and erasures. The full Reed-Solomon decoding works but is fairly expensive.

Moreover, increasing communications, storage, and processing demands require ever more efficient error correction including Reed-Solomon forward error correction (FEC). Consequently, it is desirable to provide improved mechanisms for implementing error correction.

SUMMARY

An integrated circuit may be configured to implement a Reed-Solomon (RS) erasure decoder. The RS erasure decoder may receive a transmitted message and an associated bit mask that indicates an erasure pattern for the transmitted message. In particular, the RS decoder may include a syndrome generator that receives the message and that outputs a corresponding syndrome, a storage circuit such as a read-only memory (ROM) circuit that is addressed based on the bit mask and that outputs a corresponding inverse parity matrix, and a matrix multiplication circuit that multiplies the syndrome by the inverse parity matrix to obtain corrected symbols. The RS decoder may further include an aggregator for patching the received message with the corrected symbols to obtain a corrected message.

Moreover, the RS erasure decoder may further include an address compression circuit for mapping each unique bit mask to a unique address in the ROM. If the message includes n total symbols, which includes p parity check symbols, there may be at least n!/[(n–p)!*p!] different erasure patterns. The ROM may be configured to store a corresponding inverse parity matrix for each of the different erasure patterns.

The address compression circuit may split the bit mask into upper and lower portions. The lower portion of the bit mask addresses a plurality of lookup table (LUT) circuits, whereas the upper portion of the bit mask addresses an additional lookup table (LUT) circuit. The address compression circuit may further include a plurality of multiplexing circuits that receives signals from the plurality of LUT circuits, a plurality of adder circuits that receives signals from the plurality of multiplexing circuits and the plurality of LUT circuits, a first bit counting circuit for counting a number of high bits in the upper portion of the bit mask, and a second bit counting circuit for counting a number of high bits in a subset of the lower portion of the bit mask. The second bit counting circuit may control at least some of the plurality of multiplexing circuits.

Further features of the invention, its nature and various advantages will be more apparent from the accompanying drawings and following detailed description.

DETAILED DESCRIPTION

The present embodiments provided herein relate to Reed-Solomon decoding and to circuitry for performing such decoding, particularly in an integrated circuit.

Many modern applications encode data prior to storing data on a mass storage device. As part of the data encoding, error-correcting codes such as Reed-Solomon codes are often included to allow for the detection and/or correction of data signals that were corrupted during the data transmission. Reed-Solomon codes are often used because they provide powerful error correction capabilities.

Conventional full Reed-Solomon decoding schemes typically include both error and erasure capabilities. Supporting both error code decoding (which can correct up to t symbols when 2t parity check bits are used) and erasure code decoding (which can correct up to 2t symbols) can be quite costly. Consequently, it may be desirable to provide improved mechanisms of decoding Reed-Solomon code words.

In accordance with an embodiment, a Reed-Solomon erasure coding scheme is provided that reduces the decoding problem, to a set of syndromes rather than the entire code word. For example, when an error is found, the code word will have non-erased symbols that are used to calculate a corresponding syndrome. The current erasure pattern is then used to retrieve a precomputed matrix. The syndrome can then be multiplied bv the orecomputed matrix to obtain corrected symbols. The corrected symbols obtained in this way can then foe substituted back into the received code word to correct the received code word.

In certain embodiments, Reed-Solomon decoding and/or encoding circuitry may be implemented in an integrated circuit that is coupled to a network or storage, as an example. It will be recognised by one skilled in the art, that the present exemplary embodiments may be practiced without some or all of these specific details. In other instances, well-known operations have not been described in detail in order not to unnecessarily obscure the present embodiments.

Figure 1:
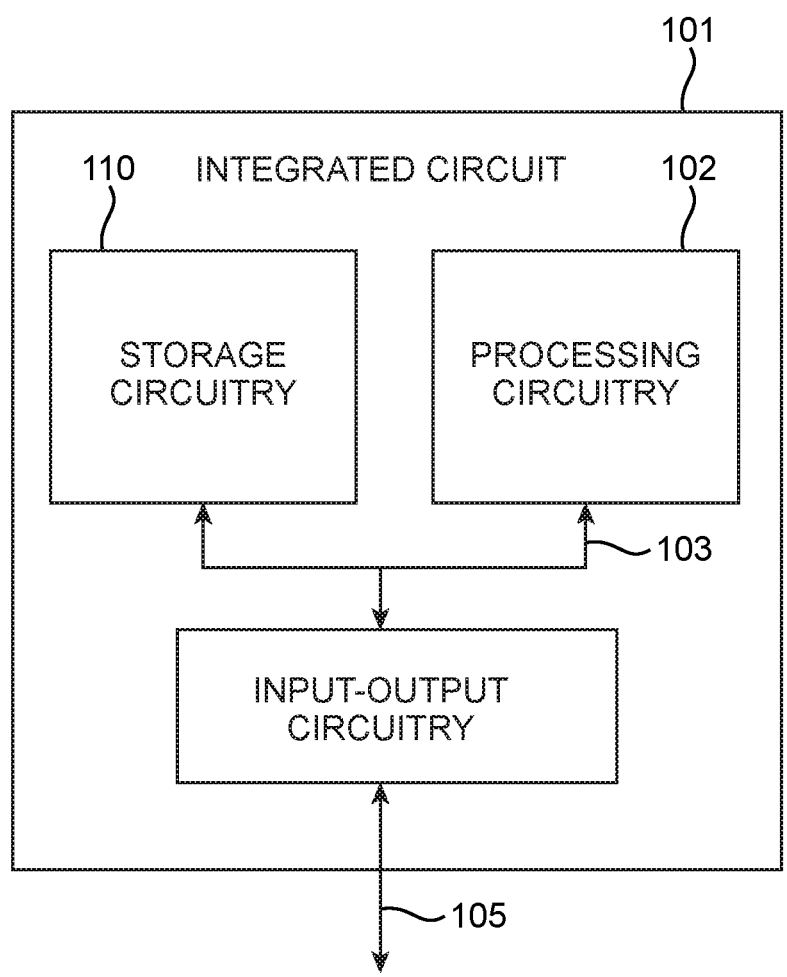
FIG. 1 is a diagram of an illustrative integrated circuit in accordance with an embodiment.

An illustrative embodimetnt of an integrated circuit 101 is shown in FIG. 1. Integrated circuit 101 may have multiple components. These components may include processing circuitry 102, storage circuitry 110, and input-output circuitry 104. Processing circuitry 102 may include embedded microprocessors, digital signal processors (DSP), microcontrollers, or other processing circuitry.

Storage circuitry 110 may have random-access memory (RAM), read-only memory (ROM), or other addressable memory elements. Storage circuitry 110 may be a single-port memory, a dual-port memory, a quad-port memory, or have any other arbitrary number of ports. If desired, storage circuitry 110 may be implemented as a single-port memory with control circuitry that emulates dual-port, quad-port, or other multi-port behavior. Processing circuitry 102 may access storage circuitry 110 by sending read and/or write requests over interconnection resources 103 to storage circuitry 110. In some embodiments, external components may access storage circuitry 110 via external interconnection resources 105, input-output circuitry 104, and interconnection resources 103. In response to receiving a read request, storage circuitry 110 may retrieve the requested data and send the retrieved data over interconnection resources 103 to the requestor. In case of a write request, storage circuitry 110 may store the received data.

Internal interconnection resources 103 such as conductive lines and busses may be used to send data from one component to another component or to broadcast data from one component to one or more other components. External interconnection resources 105 such as conductive lines and busses, optical interconnect infrastructure, or wired and wireless networks with optional intermediate switches may be used to communicate with other devices.

Input-output circuitry 104 may include parallel input-output circuitry, differentiai input-output circuitry, serial data transceiver circuitry, or other input-output circuitry suitable to transmit and receive data. If desired, input-output circuitry 104 may include error detection and/or error correction circuitry. For example, input-output circuitry 104 may include Reed-Solomon encoding and/or decoding circuitry that encode data signals by creating Reed-Solomon code words based on the data signals before the data transmission or decode Reed-Solomon code words after the data reception to allow for error correction and reconstitution of the data signals.

Figure 2:
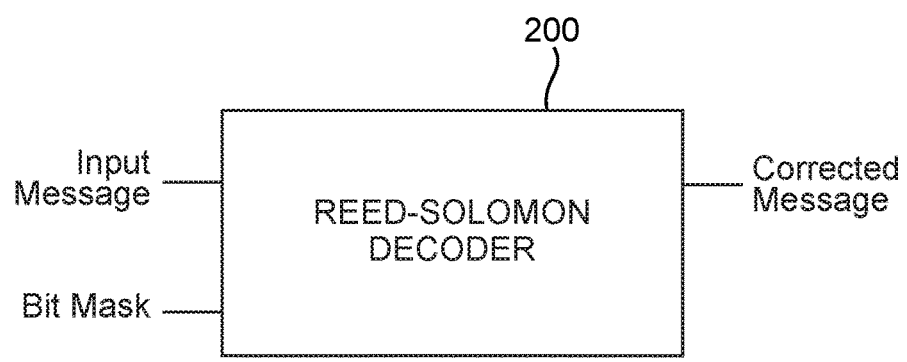
FIG. 2 is a diagram of an illustrative Reed-Solomon decoder circuit that is configured to receive an input message and an associated bit mask in accordance with an embodiment.

FIG. 2 illustrates such a Reed-Solomon decoder circuit such as decoder 200. As shown in FIG. 2, Reed-Solomon decoder circuit 200 may include a first input for receiving an input message (i.e., an input code word), a second input for receiving a bit mask, arid an output on which a corrected message (i.e., an output code word), is generated. The input message may include n total symbols, which include k data symbols and n–k parity check symbols. In general, the received input message may include error word e in addition to the originally transmitted Reed-Solomon code word. Reed-Solomon decoder circuit 200 may check the received message to detect and correct the error with the goal of restoring the received message.

Figure 3:
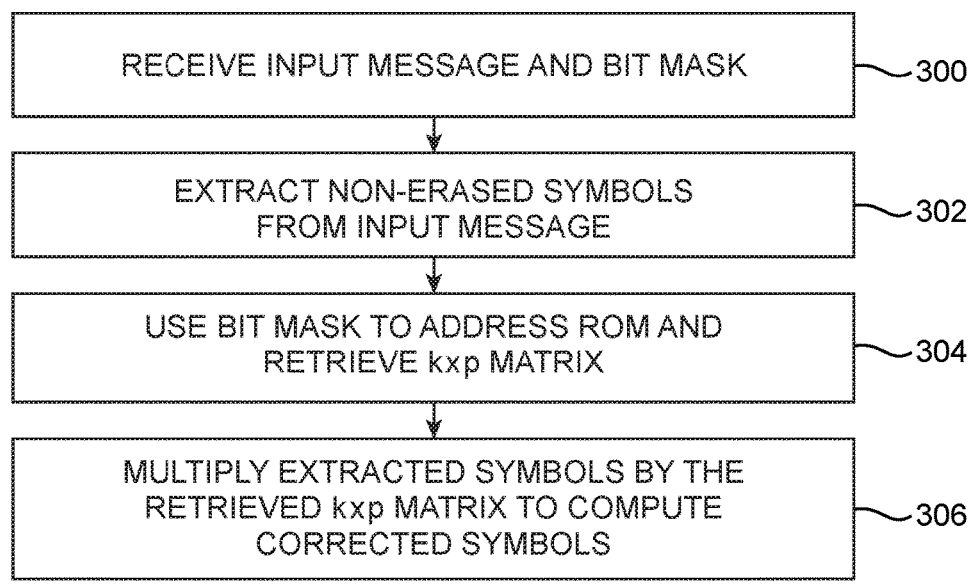
FIG. 3 is a flow chart of steps for computing corrected symbols over the entire code word.

FIG. 3 is a flow chart of steps for computing corrected symbols over the entire code word. At step 300, a Reed-Solomon decoder receives an input message and an associated bit mask. As a simplified example, the decoder can be used to decode a Reed-Solomon encoding RS(n=5,k=3). In the RS(5,3) scheme, the number of parity check symbols p may be equal to 2 (i.e., 5 minus 3 is equal to 2). For instance, the input message may be equal to vector [ε 0 εα$^{12}$ 1], where "ε" represents an erased symbol. Since the first and third symbols have been erased, the corresponding bit mask will be equal to [1 0 1 0 0], where the high bits indicate the position of the erased symbols.

At step 302, the decoder extracts the non-erased symbols from the received input message. After removing the ε symbols, the message becomes [0 α$^{12}$ 1] with only non-erased symbols remaining.

At step 304, the bit mask is used to address a read-only memory ("ROM") to load a corresponding k*p matrix (i.e., a 3-by-2 matrix in this scenario) of constant symbols. The value of the symbols in the k*p will change depending on the bit mask pattern.

At step 306, the decoder than multiplies over the Galois Field the extracted symbols obtained at step 302 by the k*p matrix retrieved at step 304 to compute corrected symbols. The corrected symbols are then used to replace the erased symbols in the message.

Computing corrected symbols in this way works but can be fairly expensive, especially when k increases. For example, consider the scenario where the decoder is used to decode a RS(14,10) code word. In this example, k=10 and p=4. As a result, the matrix multiplication performed at step 306 will now need 10*4 or 40 non-constant multipliers to compute the corrected symbols.

Figure 4:
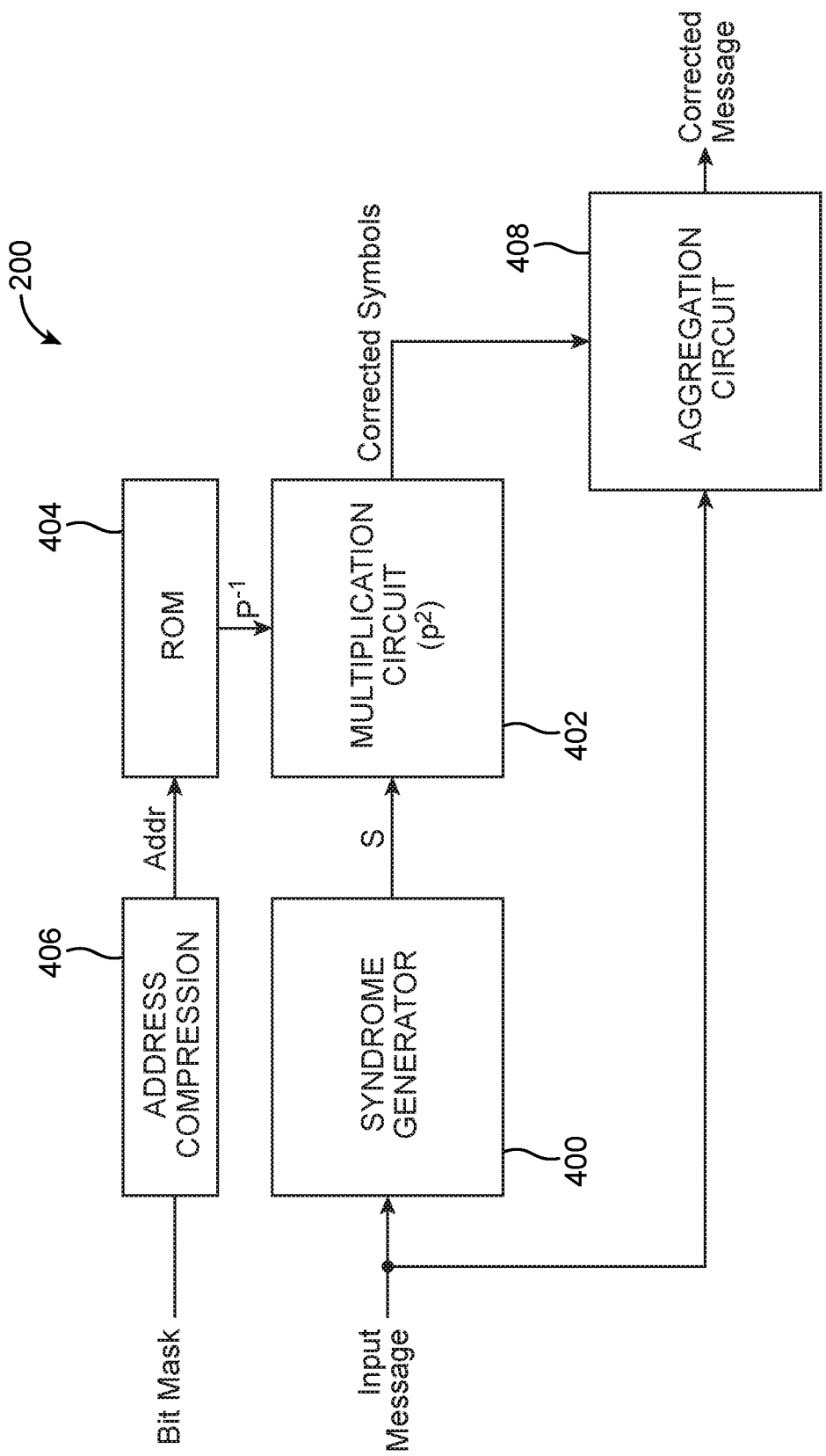
FIG. 4 is a diagram showing one suitable circuit implementstion of the Reed-Solomon decoder shown in FIG. 2 in accordance with an embodiment.

In accordance with an embodiment of the present invention, a Reed-Solomon decoder circuit such as RS decoder 200 of FIG. 4 is provided that reduces the problem to only a set of syndromes rather than the entire code word. To understand how this scheme works, consider a scenario where the decoder receives a RS(5,2) code word. Since k=2, the received message will include three erasures, and p=3. Even if the received message includes less than three erased symbols, it is always possible to erase additional symbols until the maximum number of erasures has been reached.

For example, consider a scenario where the input message is equal to [c5 ε4 c3 ε2 ε1]. Since p=3, a corresponding parity matrix P may be multiplied with the input message to obtain three syndromes, where P includes check symbols as follows:

$$P = \begin{bmatrix} p_{53} & p_{52} & p_{51} \\ p_{43} & p_{42} & p_{41} \\ p_{33} & p_{32} & p_{31} \\ p_{23} & p_{22} & p_{21} \\ p_{13} & p_{12} & p_{11} \end{bmatrix} \quad (1)$$

Assuming the message has no errors, the computed syndromes should all be equal to zero, which is stated as follows:

$$s_1 = p_{51} \cdot c_5 + p_{41} \cdot \varepsilon_3 + p_{31} \cdot c_3 + p_{21} \cdot \varepsilon_2 + p_{11} \cdot \varepsilon_1 = 0$$

$$s_2 = p_{52} \cdot c_5 + p_{42} \cdot \varepsilon_3 + p_{32} \cdot c_3 + p_{22} \cdot \varepsilon_2 + p_{12} \cdot \varepsilon_1 = 0$$

$$s_3 = p_{53} \cdot c_5 + p_{43} \cdot \varepsilon_3 + p_{33} \cdot c_3 + p_{23} \cdot \varepsilon_2 + p_{13} \cdot \varepsilon_1 = 0 \quad (2)$$

In order to separate the erasure indices [i=ε] from the non-erasure indices (i)\ε, the corresponding erasure symbols can then be added to both sides of equations 2. Since X+X=0 in the Galois Field, equations 2 then become:

$$p_{51} \cdot c_5 + p_{31} \cdot c_3 = p_{41} \cdot \varepsilon_3 + p_{21} \cdot \varepsilon_2 + p_{11} \cdot \varepsilon_1$$

$$p_{52} \cdot c_5 + p_{32} \cdot c_3 = p_{42} \cdot \varepsilon_3 + p_{22} \cdot \varepsilon_2 + p_{12} \cdot \varepsilon_1$$

$$p_{53} \cdot c_5 + p_{33} \cdot c_3 = p_{43} \cdot \varepsilon_3 + p_{23} \cdot \varepsilon_2 + p_{13} \cdot \varepsilon_1 \quad (3)$$

If the erasures are zeroed out (i.e., if ε=0 in equation 2), the left hand side of equations 3 is equal to the syndromes. Thus, equations 3 then become:

$$s_1 = p_{41} \cdot \varepsilon_3 + p_{21} \cdot \varepsilon_2 + p_{11} \varepsilon_1$$

$$s_2 = p_{42} \cdot \varepsilon_3 + p_{22} \cdot \varepsilon_2 + p_{12} \varepsilon_1$$

$$s_3 = p_{43} \cdot \varepsilon_3 + p_{23} \cdot \varepsilon_2 + p_{13} \varepsilon_1 \qquad (4)$$

Equation 4 can foe represented using the notation for erasure indices (i=ε), so equation 4 can be rewritten more generally as:

$$s = c_{(i)=\varepsilon} \cdot P_{(i)=\varepsilon} \qquad (5)$$

The goal of decoding is to compute corrected erasure symbols $c_{(i)=\varepsilon}$. Thus., $c_{(i)=\varepsilon}$ can be solved by multiplying the inverse of the erasure-only parity matrix $P_{(i)=\varepsilon}$ to both sides of equation 5 so that:

$$c_{(i)=\varepsilon} = S \cdot P_{(i)=\varepsilon}^{-1} \qquad (6)$$

Syndrome vector S can be computed in real time based on the received message. Inverse parity matrix $P_{(i)=\varepsilon}^{-1}$ is specific to each erasure pattern and can be commuted in advance. Thus, the inverse parity matrix for each possible erasure pattern can be precomputed and then stored in a ROM for quick retrieval during real-time computation of the corrected symbols.

The configuration of decoder 200 in FIG. 4 takes advantage of this finding. As shown in FIG. 4, decoder 200 may include a syndrome generator circuit such as syndrome generator 400, a multiplication circuit such as multiplier 402, a storage component such as read-only memory (ROM) 404, an address compression circuit such as address compressor 406, and an aggregation circuit such as aggregator 408.

Syndrome generator 400 may receive the input message and may output a corresponding syndrome vector S. The syndrome vector will have a length that is equal to the number of parity symbols p. In particular, the syndrome generator will assume that all erased symbols ε in the input message is equal to zero. This is merely illustrative. If desired, the syndrome generator may substitute symbols ε with other suitable predetermined values. It is also possible to use the actual (unreliable) values of the erased symbols in the syndrome calculation. This would require a minor modification to. the final aggregation stage 408. For example, rather than simply replacing each erased symbol with the syndrome-calculated version, we would add both versions to obtain the final result. This effectively cancels out the unknown value received at the input.

Again, consider the scenario where RS(5,3) receives an input message [ε 0 εα¹² 1]. Instead of obtaining an extracted vector with k=3 symbols as described above during step 302 of FIG. 3, syndrome generator 400 may output syndrome vector S with only p=2 symbols.

Since the first and third positions have erased symbols, the bit mask will be equal to [1 0 1 0 0], with the asserted bits indicating the position of the erased symbols. The bit mask may sometimes be referred to as a decode mask that represents an erasure pattern for the received code word. Address compressor 406 may serve to map each valid decode mask pattern to a unique ROM address Addr. Depending on the signature of the bit mask, a corresponding precomputed matrix $P^{-1}$ can be retrieved quickly from ROM (read-only memory) 404. Matrix $P^{-1}$ will have a size p-by-p.

Multiplication circuit 402 may receive syndrome vector S (which includes only p symbols) and may also receive inverted matrix $P^{-1}$ (which includes p-by-p symbols). Thus, circuit 402 may perform a $p^2$ multiplication over the Galois Field by multiplying syndrome vector S by matrix $P^{-1}$ in accordance with equation 6 to obtain corrected symbols. Aggregation circuit 408 may then use the corrected symbols output from multiplier 402 to patch the input message (e.g., by replacing the erasure symbols by the corrected symbols). Thus, a corrected message where the erasure symbols have been replaced by the corrected symbols may be provided at the output of aggregator 408.

Computing corrected symbols in this way not only works but scales nicely even if k increases. For example, consider the scenario where the decoder is used to decode a RS(14, 10) code word. In this example, k=0 and p=4. As a result, multiplication circuit 402 will only need $p^2$=4×4 or 16 non-constant multipliers to compute the corrected symbols. This is a dramatic reduction compared to the 40 non-constant multiplier arrangement that would otherwise be required, as described above in connection with FIG. 3. By reducing the decoding problem to only the set of syndromes with length p, the size of RS decoder 200 can be reduced by 60% or more.

Figure 5:
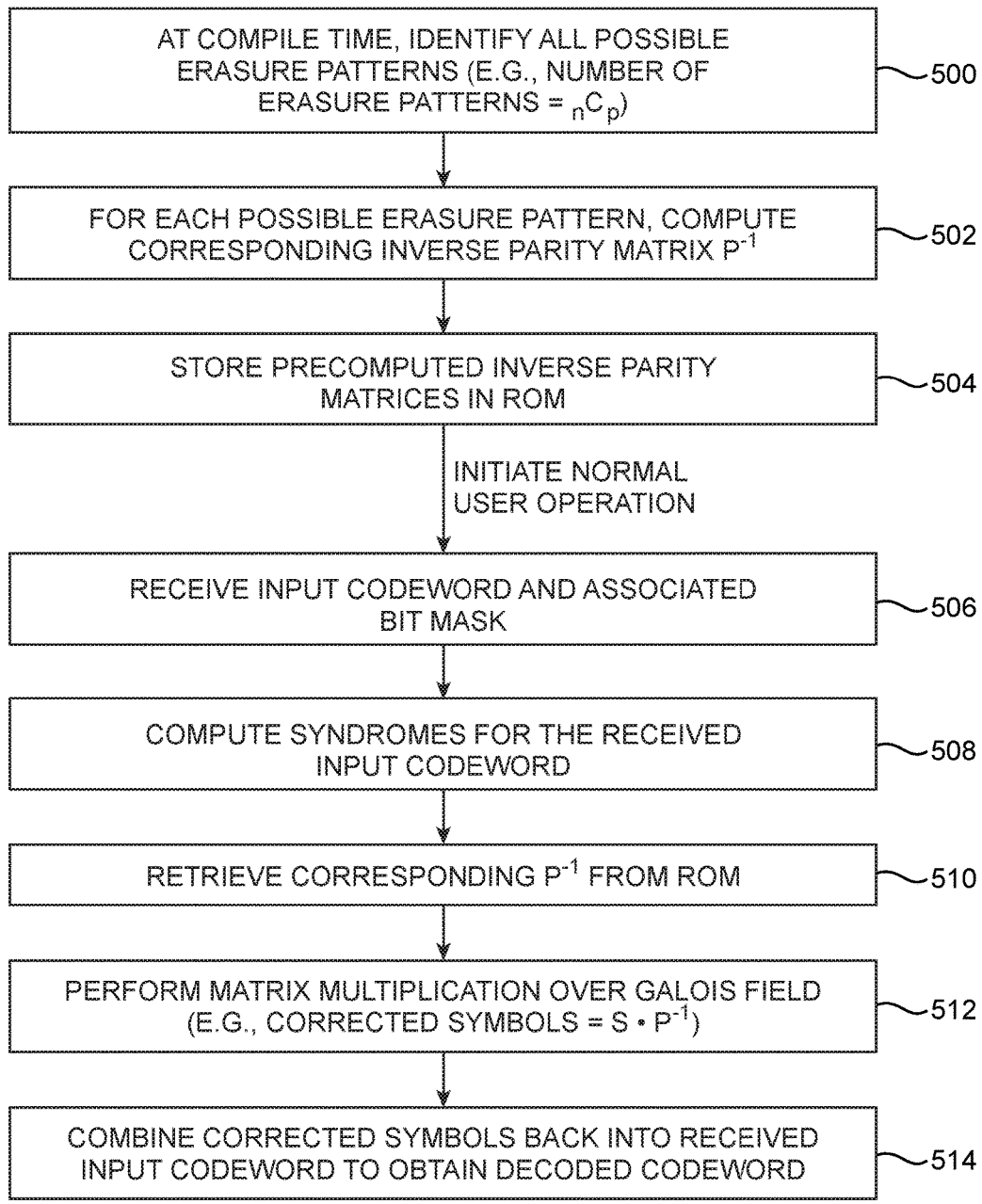
FIG. 5 is a flow chart of illustrative steps for operating a Reed-Solomon decoder of the type shown in FIG. 4 in accordance with an embodiment.

FIG. 5 is a flow chart of illustrative steps for operating a Reed-Solomon decoder of the type shown in FIG. 4 in accordance with an embodiment. In at least some arrangements, integrated circuit 101 may be a programmable integrated circuit. The programmable integrated circuit may have a circuit design (e.g., a design often represented in the form of a hardware description language) that is compiled to generate a configuration bit stream that can then be loaded onto the programmable IC die to implement a custom user logic function.

In particular, during compile time, logic design tools may identify all possible erasure patterns depending on the number of parity symbols (step 500). For example. the total possible number of erasure patterns for RS(n,k), where p=n−k, can be computed using the combination formula:

$$\# \text{ erasures} = {}_nC_p = \frac{n!}{(n-p)! * p!} \qquad (7)$$

Thus, for RS(14,10), the total number of possible erasure patterns will be equal to 1001 using formula 7. Thus, ROM 404 should have at least 1001 entries for storing 1001 unique $P^{-1}$ matrices.

At step 502, the logic design tools may precompute a corresponding inverse parity matrix $P^{-1}$ for each erasure pattern. At step 504, the precomputed inverse parity matrices may then be stored in ROM 404. Thereafter, the RS decoder may be placed in normal user mode.

During normal user operation, decoder 200 may receive an input code word and an associated bit mask. At step 508, syndrome generator 400 may compute syndromes for the received code word. At step 510, the bit mask may be used to address ROM 404 (e.g., address compression circuit 406 may optionally be used to map the bit mask to a unique ROM address) to retrieve the desired matrix $P^{-1}$.

At step 512, multiplication circuit 402 may perform a matrix multiplication operation over the Galois Field to generate corrected symbols (e.g., the corrected symbols may be equal to the syndromes computed at step 508 multiplied by the inverse parity matrix retrieved at step 510). At step 514, aggregator 408 may then be used to combine the corrected symbols back into the received input code word to obtain a decoded/corrected code word.

In general, an n-bit bit mask having at most p bits set high indicating the erasure positions has a total maximum number of unique bit masks that can be computed using formula 7. It may be desirable to map each possible bit mask to a unique address in the ROM. It may also be desirable to map bit masks with fewer than p bits set to the address of a compatible bit mask with exactly p bits set. A "compatible" bit mask implies that erasures may be artificially introduced but never removed. Addresses corresponding to bit masks with more than p bits set can be anything.

In the example above that supports RS(14,10), a naive implementation would simply use a ROM of depth $2^{14}$. However, since there are only 1001 different erasure patterns, a ROM depth of $2^{10}$ would suffice. Since p=4 in this example, there will be 4 parity symbols, supporting up to 4 erasures. The corresponding bit mask will have 14 bits, of which no more than 4 bits should be set high.

As described above, address compressor 406 serves to map each valid bit mask to a unique ROM address. A bit mask is therefore sometimes referred to as a bit "map." A family of mappings $f_{w,e}$ from bit masks of width w containing at most e (which is less than or equal to w) bits set to the integers. For a bit mask m with exactly e bits set, $f_{w,e}(m)$ will be the position of m in the sequence of such bit maps, ordered by the bit map as an integer. For example:

$$f_{6,2}('000011')=0$$

$$f_{6,2}('000101')=1$$

$$f_{6,2}('000110')=2$$

$$f_{6,2}('001001')=3$$

$$f_{6,2}('001010')=4 \quad (8)$$

and so on. For a bit mask m with fewer than e bits set, $f_{w,e}(m)$ will be equal to $f_{w,e}(m')$, where m' is the smallest integer bit map which satisfies both conditions:

a) m' has exactly e bits set b) the set bits of e are a superset of the set bits of m    (9)

For example:

$$f_{6,2}(m)=f_{6,2}(m')=\text{integer } X$$

$$f_{6,2}('000000')=f_{6,2}('000011')=0$$

$$f_{6,2}('000001')=f_{6,2}('000011')=0$$

$$f_{6,2}('000010')=f_{6,2}('000011')=0$$

$$f_{6,2}('000100')=f_{6,2}('000101')=1$$

$$f_{6,2}('001000')=f_{6,2}('001001')=3 \quad (10)$$

and so on. As described above, for a bit mask with more than e bits set, $f_{w,e}(m)$ will be undefined.

To calculate $f_{n,p}(m)$ where m is a bit mask containing n bits, of which at most p bits should be set high, it may be desirable to split m into two parts. For example, consider the calculation of $f_{14,4}(m)$. In this example, mask m may be split into a first part $m_h$ containing 4 bits and a second part mi containing the remaining 10 bits. The fact that the number of bits in $m_h$ is equal to p here is a coincidence. Four bits is merely a useful chunk size in a digital integrated circuit, but in general, $m_h$ could have used a chunk size of 5 bits, 6 bits, etc.

The mapping $f_{14,4}(m)$ can then be calculated as follows:

$$f_{14,4}(m)=f_{14,4}(m_h \ \& \ '0000000000')+f_{10,e}(m_l) \quad (11)$$

where e is equal to 4-bitcount ($m_h$). In equation 11, the operator "&" used to denote bit mask concatenation and not the logical "AND" operation.

Figure 6:
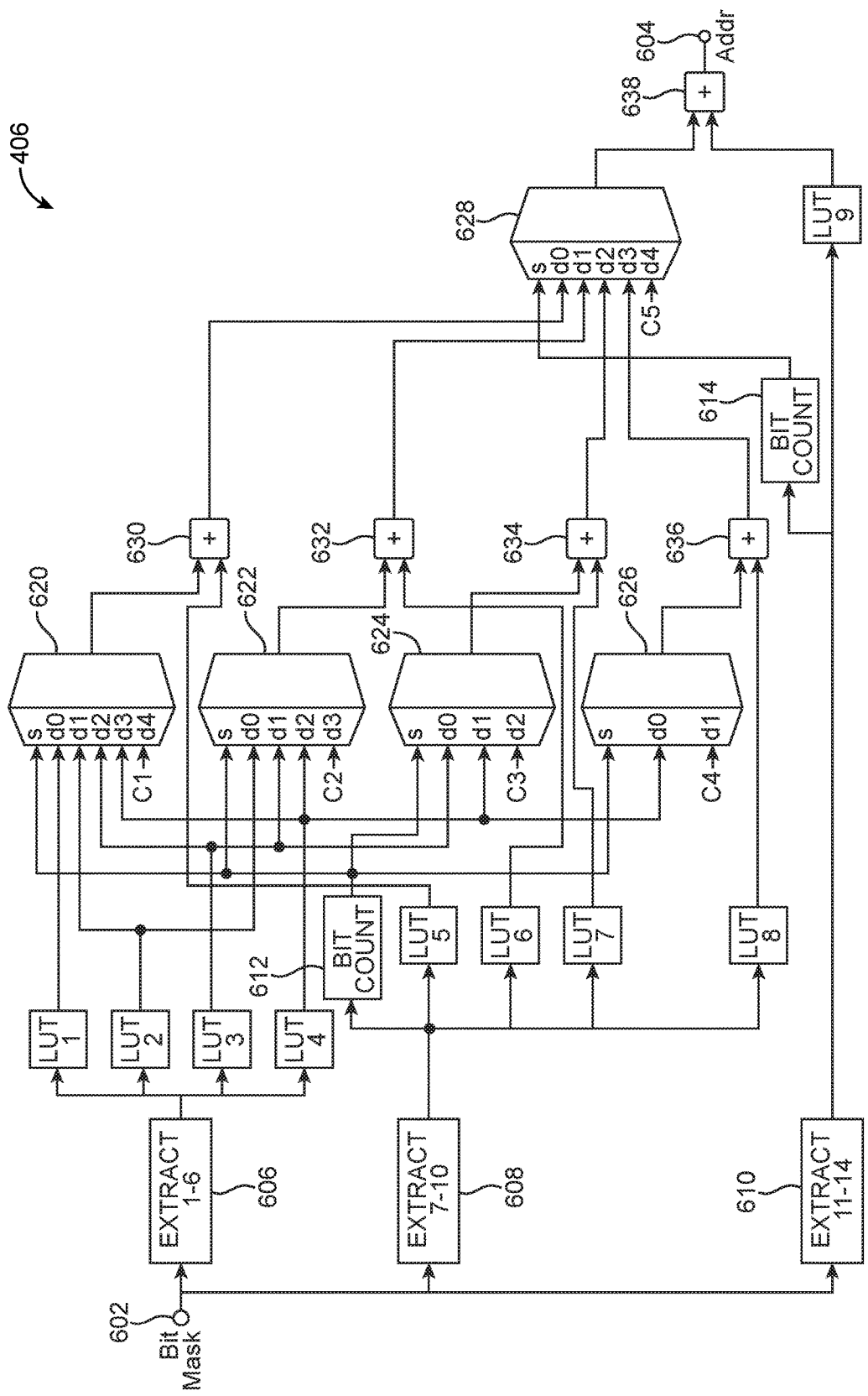
FIG. 6 is a diagram of an illustrative address compression circuit that can be used for mapping each valid decode mask to a unique ROM address in accordance with an embodiment.

FIG. 6 is a diagram showing one suitable implementation of address compression circuit 406 that can be used to carry out the calculations above. As shown in FIG. 6, compressor 406 may include an input for receiving a bit mask, bit extraction circuits 606-610, lookup table (LUT) circuits LUT1-9, bit counting circuits 612, 614, multiplexers 620-628, adders 630-638, and an output at which a mapped address signal Addr is provided. In the example where $f_{14,4}(m)$ is supported, first extractor 606 may be used to extract the 6 lower bits from the bit mask, second extractor 608 may be used to extract the 4 middle bits from the bit mask, and third extractor 610 may be used to extract the 4 upper bits from the bit mask.

Extractor 606 may have an output that addresses LUT1-4. Extractor 608 may have an output that addresses LUT5-8. Extractor 610 may have an output that addresses LUT9. Bit counter 612 may be used to count the number of high bits set at the output of extractor 608 and may have an output that is fed to the control input (s) of multiplexers 620, 622, 624, and 626. Similarly, bit counter 614 may be used to count the number of high bits set at the output of extractor 610 and may have an output that is fed to the control input (s) of multiplexer 628.

Multiplexer 620 may have data inputs d0-d3 that receive bits from LUT1-LUT4, respectively, and also remaining data input (s) d4 that receive a constant C1. Multiplexer 622 may have data inputs d0-d2 that receive bits from LUT2, LUT3, and LUT4, respectively, and also remaining data input(s) d3 that receive a constant C2. Multiplexer 624 may have data inputs d0,d1 that receive bits, from LUT3 and LUT4, respectively, and also remaining data input(s) d2 that receive a constant C3. Multiplexer 626 may have first data input d0 that receives bits from LUT4 and second data input e1 that receives a constant C4'.

Adder 630 may receive bits from multiplexer 620 and LUT5. Adder 632 may receive bits from multiplexer 622 and LUT6. Adder 634 may receive bits from multiplexer 624 and LUT7. Adder 636 may receive bits from multiplexer 626 and LUT8. Multiplexer 628 may have data inputs d0-d3 that receive bits from adders 630, 632, 634, and 636, respectively, and also remaining data input(s) d4 that receive a constant C5. Adder 628 may receive bits from multiplexer 628 and LUT9 and may have an output 604 at which the mapped ROM address signal Addr is provided.

In particular, $f_{14,4}(m_h \ \& \ '0000000000')$, which depends only on the upper 4 bits $m_h$ of m is calculated by LUT8. Multiplexer 628 chooses the appropriate value of $f_{10,e}(m_l)$ based on the number of bits set in $m_h$, and adder 638 performs the final addition. The intermediate results $f_{10,4}(m)$, $f_{10,3}(m)$, $f_{10,2}(m)$, and $f_{10,1}(m)$ may be calculated in a similar way as follows:

$$f_{10,4}(m)=f_{10,4}(m_h \ \& \ '0000000000')+f_{6,e}(m_l)$$

where $e$=4−bitcount($m_h$)

$$f_{10,3}(m)=f_{10,3}(m_h \ \& \ '0000000000')+f_{6,e}(m_l)$$

where $e$=3−bitcount($m_h$)

$$f_{10,2}(m)=f_{10,2}(m_h \ \& \ '0000000000')+f_{6,e}(m_l)$$

where $e$=2−bitcount($m_h$)

$$f_{10,1}(m)=f_{10,1}(m_h \ \& \ '0000000000')+f_{6,e}(m_l)$$

where $e$=1−bitcount($m_h$)    (12)

Mappings $f_{10,4}(m_h \& \text{'000000'})$, $f_{10,3}(m_h \& \text{'000000'})$, $f_{10,2}(m_h \& \text{'000000'})$, and $f_{10,1}(m_h \& \text{'000000'})$ may be calculated using LUT5-LUT8, respectively. Multiplexers 620, 622, 624, and 626 may select the appropriate value of $f_{6,e}(m_1)$ to add, based on the bit count value of $m_h$. Mappings $f_{10,4}(m)$, $f_{10,3}(m)$, $f_{10,2}(m)$, $f_{10,1}(m)$, and $f_{10,0}(m)$ may be calculated by adders 630, 632, 634, 636, and C5, respectively. Note that $f_{10,0}(m)$ is zero for the only legal value of m and undefined for other bit masks. Finally, $f_{6,4}(m)$, $f_{6,3}(m)$, $f_{6,2}(m)$, and $f_{6,1}(m)$ are implemented by direct lookup in LUT1-LUT4, respectively. Mapping $f_{6,0}(m)$ is constant zero and is implemented by C1-C4.

The implementation of address compressor 406 show in FIG. 6 is merely illustrative. If desired, address compression circuit 406 may be implemented using other suitable mapping architechtures.

The foregoing is merely illustrative of the principles of this invention and various modi fications can be made by those skilled in the art. The foregoing embodiments may be implemented individually or in any combination.

What is claimed is:

1. An integrated circuit, comprising:
  a Reed-Solomon decoder circuit that comprises:
    a first input that receives a message;
    a second input that receives a bit mask indicating an erasure pattern of the message;
    a storage circuit that is addressed using the bit mask and that outputs an inverse parity matrix;
    a syndrome generator that receives the message and that outputs a corresponding syndrome; and
    a matrix multiplication circuit that multiplies the syndrome by the inverse parity matrix and outputs corrected symbols.

2. The integrated circuit of claim 1, wherein the storage circuit comprises read-only memory (ROM).

3. The integrated circuit of claim 1, wherein the Reed-Solomon decoder circuit further comprises:
  an address compression circuit interposed between the second input and the storage circuit.

4. The integrated circuit of claim 1, wherein the message includes n total symbols, wherein the n total symbols include p parity symbols, and wherein the storage circuit is configured to store at least n!/[(n–p)!*p!] inverse parity matrices.

5. The integrated circuit of claim 1, wherein the message includes p parity symbols, and wherein the matrix multiplication circuit is configured to perform $p^2$ multiplications in the Galois Field.

6. The integrated circuit of claim 1, wherein the Reed-Solomon decoder circuit furthe comprises:
  an aggregation circuit that combines the message with the corrected symbols.

7. A method of operating an integrated that includes a Reed-Solomon decoder, the method, comprising:
  with the Reed-Solomon decoder, receiving a code word and an associated bit mask;
  using the bit mask to address a storage circuit in the Reed-Solomon decoder;
  in response to addressing the storage circuit with the bit mask, retrieving an inverse parity matrix from the storage circuit;
  with a syndrome generator in the Reed-Solomon decoder, receiving the code word and generating a corresponding syndrome;
  with a matrix multiplication circuit in the Reed-Solomon decoder, multiplying the syndrome by the inverse parity matrix to generate corrected symbols.

8. The method of claim 7, further comprising:
  with an aggregator circuit in the Reed-Solomon decoder, patching the received code word with the corrected symbols.

9. The method of claim 7, further comprising:
  precomputing a plurality of inverse parity matrices based on possible erasure patterns of the code word; and
  loading the plurality of precomputed inverse parity matrices onto the storage circuit.

10. The method of claim 7, wherein the code word includes p parity symbols, and wherein multiplying the syndrome by the inverse parity matrix comprises using the matrix multiplication circuit to perform $p^2$ multiplications in the Galois Field.

11. A Reed-Solomon decoder circuit, comprising:
  a first input that receives a code word;
  a second input that receives a bit mask that indicates an erasure pattern of the received code word;
  an address compression circuit that splits the bit mask into an upper portion and a lower portion;
  a syndrome generator that receives the code word and that generates a corresponding syndrome vector;
  read-only memory that receives an address signal from the address eorapression circuit and that outputs a corresponding inverse parity matrix; and
  a matrix multiplication circuit that multiplies the syndrome vector by the inverse parity matrix to generate a corrected code word.

12. The Reed-Solomon decoder circuit of claim 11, wherein the lower portion of the bit mask addresses a plurality of lookup table (LUT) circuits, and wherein the upper portion of the bit mask addresses an additional lookup table (LUT) circuit.

13. The Reed-Solomon decoder circuit of claim 12, wherein the address compression circuit further includes:
  a plurality of multiplexing circuits that receives signals from the plurality of LUT circuits; and
  a plurality of adder circuits that receives signals from the plurality of multiplexing circuits and the plurality of LUT circuits.

14. The Reed-Solomon decoder circuit a claim 13, wherein the address compression circuit further includes:
  a first bit counting circuit for counting a number of high bits in the upper portion of the bit mask; and
  a second bit counting circuit for counting a number of high bits in a subset of the lower portion of the bit mask, wherein the second bit counting circuit controls at least some of the plurality of multiplexing circuits.

* * * * *